(12) United States Patent
Strisower et al.

(10) Patent No.: US 10,306,791 B2
(45) Date of Patent: May 28, 2019

(54) FLASH DRIVE PACKAGES AND DEVICES

(71) Applicant: FlixChip Corp., Chico, CA (US)

(72) Inventors: John Strisower, Chico, CA (US);
Hampton Maxwell, Chico, CA (US);
David Kuehne, Chico, CA (US); Greg Helland, Stockton, CA (US)

(73) Assignee: GoChip Inc., Chico, CA (US)

(*) Notice: Subject to any disclaimer, the term of this patent is extended or adjusted under 35 U.S.C. 154(b) by 0 days.

(21) Appl. No.: 14/683,072

(22) Filed: Apr. 9, 2015

(65) Prior Publication Data
US 2015/0271939 A1 Sep. 24, 2015

Related U.S. Application Data

(63) Continuation of application No. 13/756,278, filed on Jan. 31, 2013, now abandoned, which is a continuation-in-part of application No. 13/719,215, filed on Dec. 18, 2012.

(60) Provisional application No. 61/577,068, filed on Dec. 18, 2011, provisional application No. 61/593,673, filed on Feb. 1, 2012, provisional application No. 61/609,127, filed on Mar. 9, 2012, provisional application No. 61/648,594, filed on May 18, 2012.

(51) Int. Cl.
*H05K 5/02* (2006.01)
*G06K 19/00* (2006.01)

(52) U.S. Cl.
CPC ......... *H05K 5/0286* (2013.01); *G06K 19/005* (2013.01)

(58) Field of Classification Search
CPC .............................. H05K 5/0286; H05K 5/02
USPC .......................................... 361/747; 710/300
See application file for complete search history.

(56) References Cited

U.S. PATENT DOCUMENTS

| 6,367,701 B1 | 4/2002 | Fries |
| D639,301 S | 6/2011 | Anderson et al. |
| 2002/0024502 A1 | 2/2002 | Iwasaki |
| 2004/0073727 A1* | 4/2004 | Moran ................. G06F 1/1613 710/74 |

(Continued)

FOREIGN PATENT DOCUMENTS

| EP | 2445326 A2 | 4/2012 | |
| GB | 2477742 A * | 8/2011 | ............. A45C 13/00 |

(Continued)

OTHER PUBLICATIONS

Crowell, Chapter 11: Electromagnetism, pp. 651-700, http://www.lightandmatter.com/html_books/Osn/ch11.html.

(Continued)

*Primary Examiner* — Mandeep S Buttar
(74) *Attorney, Agent, or Firm* — Jinn Su

(57) ABSTRACT

A device configured to be coupled to a flash drive is described. The flash drive has a first attachment element coupled to the flash drive. The device comprises a housing having a recess configured to receive the flash drive. The recess has a plurality of contacts configured to interface with a plurality of standard contacts of the flash drive. The device also comprises a second attachment element configured to be magnetically attracted to the first attachment element of the flash drive. The first attachment element and the second attachment element have magnetic properties. The first attachment element and the second attachment element are capable of seating the flash drive in the recess.

15 Claims, 18 Drawing Sheets

(56) References Cited

U.S. PATENT DOCUMENTS

| | | |
|---|---|---|
| 2005/0109841 A1 | 5/2005 | Ryan et al. |
| 2006/0061953 A1* | 3/2006 | Le .................. G06F 1/1632 361/679.32 |
| 2006/0069814 A1 | 3/2006 | Abraham et al. |
| 2008/0093720 A1* | 4/2008 | Hiew .................. H01L 21/565 257/679 |
| 2008/0173598 A1* | 7/2008 | Fiorentino .......... H05K 5/0278 211/41.12 |
| 2008/0281165 A1* | 11/2008 | Rai .................... A61B 5/0002 600/300 |
| 2009/0176529 A1 | 7/2009 | Warren et al. |
| 2010/0191224 A1 | 7/2010 | Butcher |
| 2011/0087825 A1* | 4/2011 | Cialini ................ G06F 13/409 711/103 |
| 2011/0167180 A1* | 7/2011 | Towell ................ H04B 5/02 710/62 |
| 2011/0192857 A1 | 8/2011 | Rothbaum et al. |
| 2011/0292618 A1* | 12/2011 | Naukkarinen ........ G06F 1/1632 361/729 |
| 2012/0092822 A1* | 4/2012 | Mooring ............. G04G 17/04 361/679.21 |
| 2013/0075566 A1 | 3/2013 | Grant |
| 2013/0223019 A1 | 8/2013 | Strisower et al. |
| 2013/0223020 A1 | 8/2013 | Strisower et al. |

FOREIGN PATENT DOCUMENTS

| | | | |
|---|---|---|---|
| RU | 2163030 C2 | 2/2001 | |
| WO | WO 2011153314 A1 * | 12/2011 | .......... G06F 11/3037 |

OTHER PUBLICATIONS

Jager, Hitachi LifeStudio Desk Plus (2TB) external hard drive, PC World, Oct. 27, 2010, http://www.pcworld.idg.com.au/review/hitachi_australia/lifestudio_desk_plus_2tb/366011/.

U.S. Appl. No. 13/719,215, dated Dec. 1, 2014 non-final office action.

U.S. Appl. No. 13/756,278, dated Oct. 9, 2014 non-final office action.

PCT application PCT/US2013/024226, dated May 7, 2013 ISR/WO.

U.S. Appl. No. 14/658,134, dated Mar. 17, 2016 non-final office action.

PCT application PCT/US2015/020620, dated Sep. 30, 2015 ISR/WO.

* cited by examiner

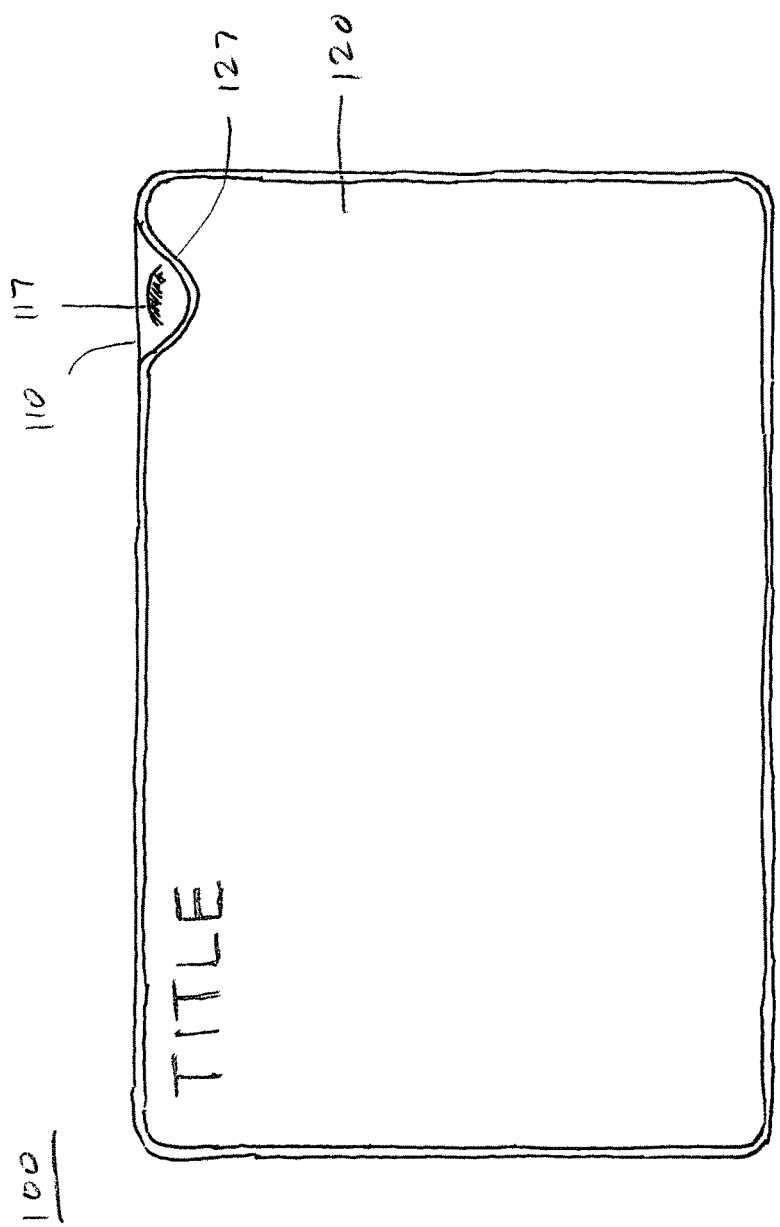

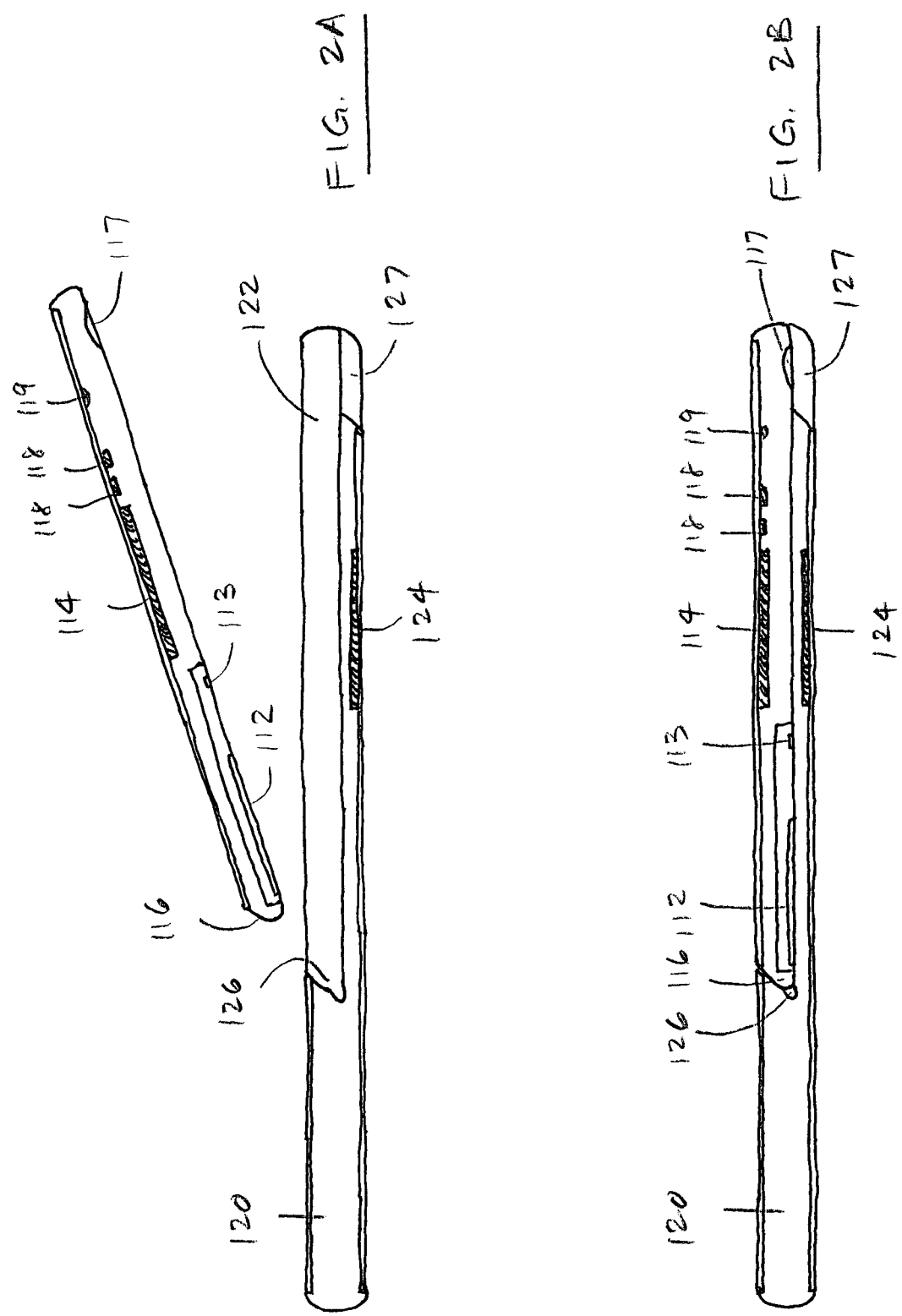

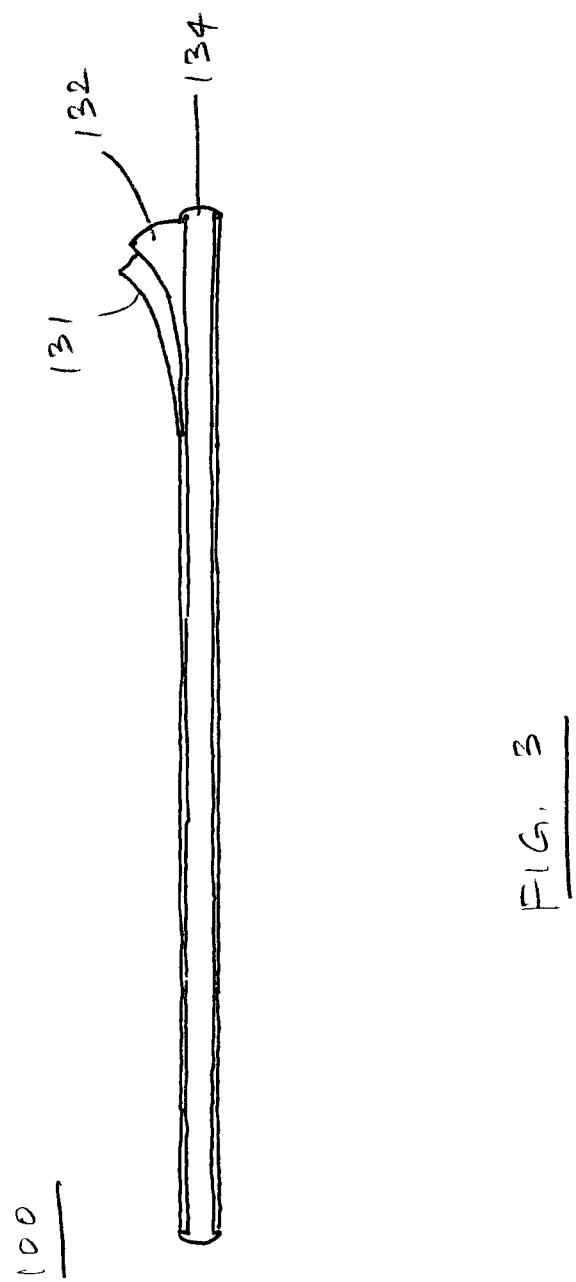

FLASH DRIVE PACKAGES AND DEVICES

CROSS-REFERENCE TO RELATED APPLICATIONS

This application is a continuation of U.S. patent application Ser. No. 13/756,278 (filed Jan. 31, 2013), which is a continuation-in-part of U.S. patent application Ser. No. 13/719,215 (filed Dec. 18, 2012), which claims the benefit of U.S. provisional application Ser. Nos. 61/577,068 (filed Dec. 18, 2011), 61/593,673 (filed Feb. 1, 2012), 61/609,127 (filed Mar. 9, 2012), and 61/648,594 (filed May 18, 2012), each of which is incorporated by reference in its entirety.

BACKGROUND

Physical media provides a way to distribute and transport movies, music, video games, and other content. Physical media may include optical media such as CDs and DVDs. However, optical media and their packaging may be bulky and unwieldy. For example, a large collection of CDs and DVDs may be inconvenient to store and access, making it a challenge to find a particular title.

Physical media may also include flash drives such as USB drives and SD cards. Flash drives typically must be inserted in a particular direction into a port to be read. However, flash drives are often inserted in the wrong direction into a port, and/or inserted only with difficulty. In addition, flash drives lack any kind of feedback that they have been properly connected. Power and other data connectors are also often inserted in the wrong direction into a receptacle or port, and/or inserted only with difficulty.

What is needed is physical media for movies, games, music, e-books, photos, and other content that is compact and easily stored and displayed for convenient access. What is also needed are devices for storing and displaying physical media for convenient access.

What is needed are flash drives and connectors that are easily aligned and/or connected. What is also needed are flash drives and connectors that provide feedback when they have been properly connected.

SUMMARY

A device configured to be coupled to a flash drive is described. The flash drive has a first attachment element coupled to the flash drive. The device comprises a housing having a recess configured to receive the flash drive. The recess has a plurality of contacts configured to interface with a plurality of standard contacts of the flash drive. The device also comprises a second attachment element configured to be magnetically attracted to the first attachment element of the flash drive. The first attachment element and the second attachment element have magnetic properties. The first attachment element and the second attachment element are capable of seating the flash drive in the recess.

A flash drive configured to be seated in a recess of a coupled device is described. The flash drive comprises a plurality of standard contacts configured to interface with a plurality of contacts in the recess of the coupled device. The flash drive also comprises a first attachment element configured to be magnetically attracted to a second attachment element coupled to the recess of the coupled device. The first attachment element and the second attachment element have magnetic properties. The first attachment element and the second attachment element are capable of seating the flash drive in the recess of the coupled device.

BRIEF DESCRIPTION OF DRAWINGS

FIGS. 1A-1B show front and back views of one embodiment of a flash drive package 100.

FIGS. 2A-2B show cross-sectional views of one embodiment of a flash drive package 100.

FIG. 3 shows an exploded view of one embodiment of a flash drive package 100.

DESCRIPTION

Figure 1B:
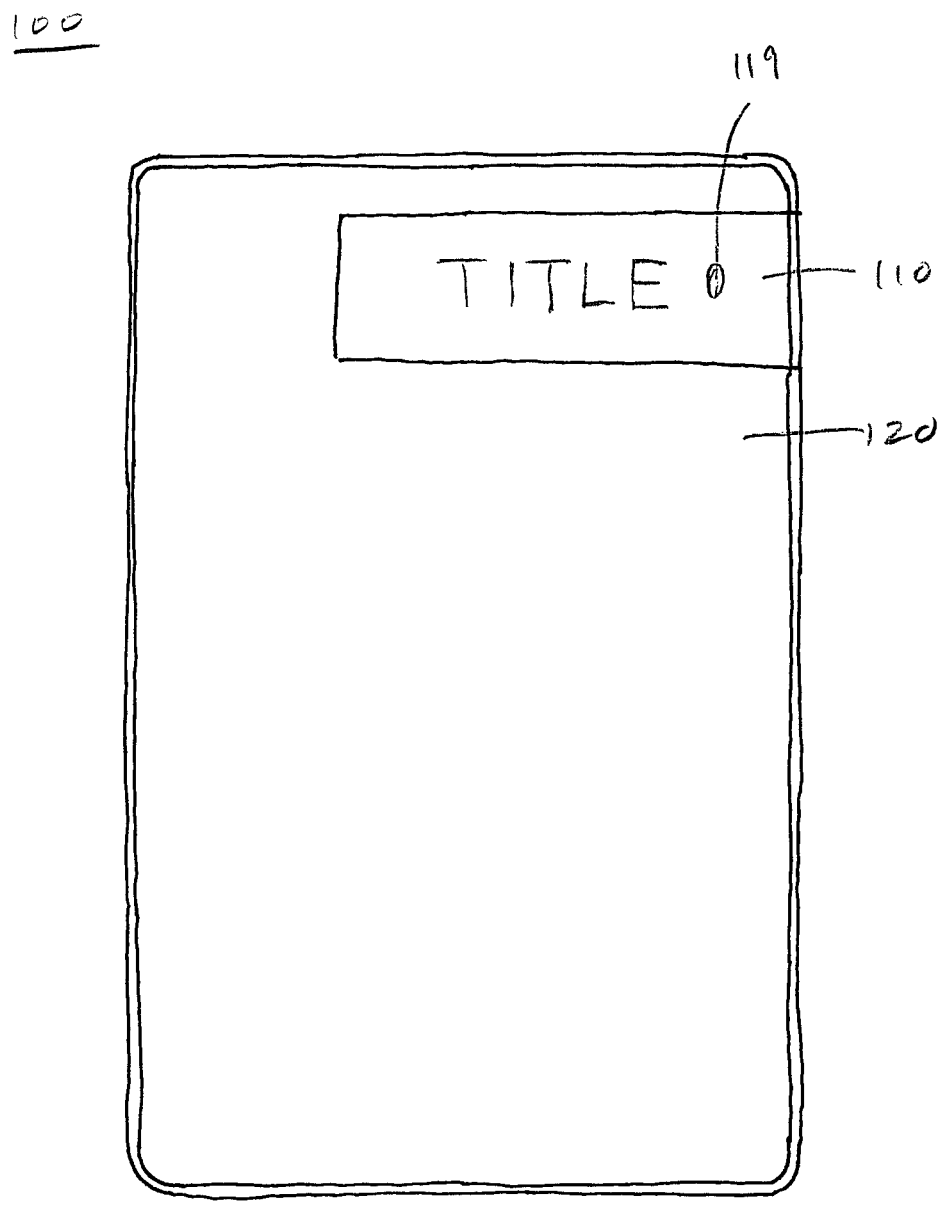
Figure 1C:
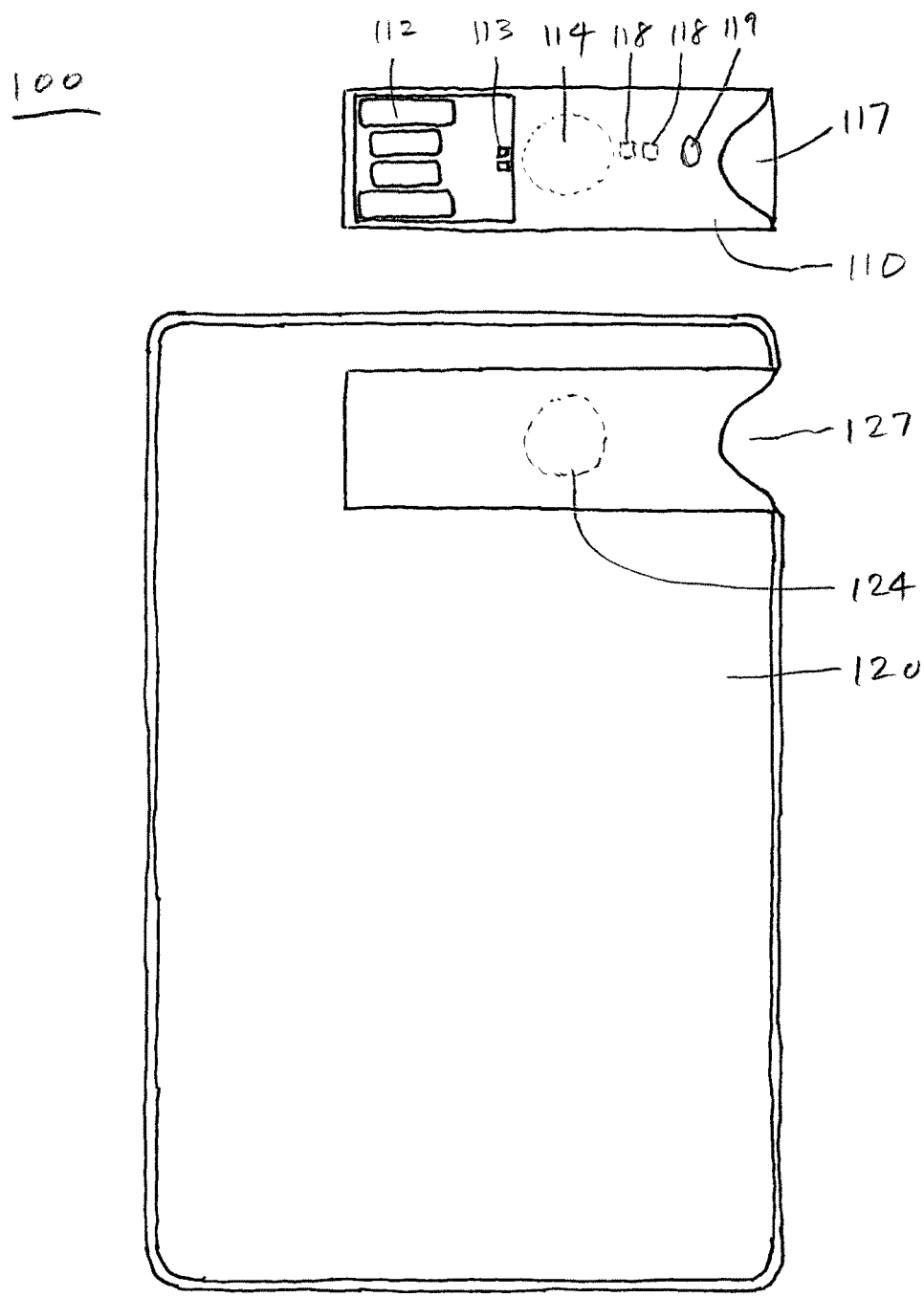
FIG. 1C shows a separated view of one embodiment of a flash drive package 100.

FIGS. 1A-1B show front and back views of one embodiment of a flash drive package 100. FIG. 1C shows a separated view of one embodiment of a flash drive package 100. Flash drive package 100 includes one or more flash drives 110 and a holder 120.

Flash drive 110 includes standard contacts 112 and a first attachment element 114. Flash drive 110 may be a USB flash drive, an SD memory card (including miniSD and microSD), or any other non-volatile memory device. Flash drive 110 may be rectangular, circular, irregularly-shaped, textured, or any other desired size and shape. First attachment element 114 may be at least partially made of a magnetic material such as neodymium, a ferromagnetic material such as iron, or other suitable material. First attachment element 114 may be formed as a disc, a bar, or other suitable shape. First attachment element 114 may be partially or fully embedded on either side of flash drive 110, or completely enclosed within flash drive 110. Standard contacts 112 allow flash drive 110 to interface with another device. Standard contacts 112 may be located on one or more exterior surfaces of flash drive 110. Standard contacts 112 may be configured to be read-only. Optionally, flash drive 110 may include loading contacts 113 which may be used by a manufacturer to load content. Loading contacts 113 may be configured to allow reading and writing.

Holder 120 includes a recess 122 and a second attachment element 124. In one embodiment, holder 120 is approximately the same size as a credit card. In other embodiments, holder 120 may be rectangular, circular, irregularly-shaped, textured, or any other desired size and shape. Recess 122 is configured to receive flash drive 110. Recess 122 may be approximately the same shape and size as flash drive 110, and flash drive 110 fits substantially flush in recess 122. Second attachment element 124 may be at least partially made of a magnetic material such as neodymium, a ferromagnetic material such as iron, or other suitable material. Second attachment element 114 may be formed as a disc, a bar, or other suitable shape. Second attachment element 124 may be partially or fully embedded on either side of holder 120, within recess 122, or completely enclosed within holder 120. Second attachment element 124 may be substantially aligned with first attachment element 114 when flash drive 110 is placed in recess 122 of holder 120. Alternatively, second attachment element 124 may be offset from first attachment element 114.

First attachment element 114 and second attachment element 124 are selected to be magnetically attracted to each other. For example, first attachment element 114 may be a magnet and second attachment element 124 may be a ferromagnetic material. As another example, first attachment element 114 may be a ferromagnetic material and second attachment element 124 may be a magnet. As yet another example, first attachment element 114 and second attachment element 124 may both be magnets.

First attachment element 114 and second attachment element 124 are configured to urge flash drive 110 into recess 122 when flash drive 110 is not fully seated in recess 122, and to fully seat flash drive 110 in recess 122. When flash drive 110 is seated in recess 122, first attachment element 114 and second attachment element 124 may cause an audible and/or tactile feedback such as a click or a snap to be generated. First attachment element 114 and second attachment element 124 may also be configured to orient or accept flash drive 110 in a desired direction.

Flash drive 110 may include a finger tab 117, and holder 120 may include a finger notch 127. Finger notch 127 is continuous with recess 122. Finger notch 127 allows access to finger tab 117 to permit flash drive 110 to be more easily removed from holder 120.

Optionally, flash drive 110 may include an RFID tag 118 and a visual indicator 119. Visual indicator 119 may be an LED, an LCD display, or other suitable indicator. RFID tag 118 may be passive or active. RFID tag 118 includes a unique address, which when addressed by a reader may cause visual indicator 119 to activate, thus facilitating location of a particular flash drive 110. The reader may be a conventional RFID reader or interrogator, a smartphone with an RFID application, or other suitable device.

Flash drive 110 may include content such as movies, games, music, e-books, photos, or any other suitable content. Flash drive 110 may include more than one piece of content, such as multiple movies or games. Flash drive 110 may also be blank. Flash drive 110 may be packaged alone, or packaged together with other physical media such as DVD and BLU-RAY containing the same or similar content. Flash drive 110 may be configured to operate with DRM mechanisms such as CPRM or other schemes. Flash drive 110 may be configured to work with digital rights lockers such as ULTRAVIOLET and KEYCHEST. For example, flash drive 110 may be packaged with an ULTRAVIOLET activation/redemption code which allows a user to add the content to a digital rights locker. Flash drive 110 may be activated upon purchase in a store or activated later online.

A title for stored content may be printed on an exterior surface of flash drive 110. The title of the content may also be printed on an exterior surface of holder 120. The title of the content may be located along the edge of holder 120 to facilitate search and access. Graphics may be printed on the front and/or back of flash drive 110 and or holder 120. The graphics may form a continuous whole when flash drive 110 is placed in holder 120. The graphics may be commercially produced. The graphics may also be provided by a user to create an individually customized and personalized flash drive 110 and holder 120. The graphics may include a hologram. The graphics may include a three-dimensional image which may be viewed using similar 3D eyeglasses as are used for 3D television and movies, and may correlate with 3D content on flash drive 110. The graphics may include artwork, logos, or any other suitable graphics. The graphics may include the capacity of flash drive 110. The graphics may include a resolution of content on flash drive 110. Flash drive 110 and holder 120 may also have exterior surfaces that are blank.

FIGS. 2A-2B show cross-sectional views of flash drive 110 being inserted into holder 120. Flash drive 110 may include an edge that has a ridge 116 which mates with a catch 126 in recess 122. Catch 126 may be deeper than ridge 116 so that dust and other debris do not prevent flash drive 110 from seating in recess 122. Ridge 116 may be formed on a short edge or long edge of flash drive 110. Alternatively, flash drive 110 may have edges without ridge features.

FIG. 3 shows an exploded view of one embodiment of a flash drive package 100. Flash drive package 100 may be constructed of a plurality of layers bonded together, including a plastic layer 131, graphics layer 132 with graphics, and a plastic substrate 134. Plastic layer 131 may be substantially clear. Plastic layer 131 may be fingerprint, scratch, and/or UV resistant. Graphics layer 132 may be a photographic paper, or other suitable paper. Plastic substrate 134 may be at least partially made of a clear or translucent plastic which acts as a light guide, such as acrylic. Plastic substrate 134 may also be sized larger than graphics layer 132 to create one or more protruding edges. The protruding edges may be illuminated by visual indicator 119 such as and LED. The protruding edges may be rounded, square, or other suitable configuration. Plastic substrate 134 may be recessed so that plastic layer 131 and graphics layer 132 fit substantially flush with the edge of plastic substrate 134. Flash drive 110 and/or holder 120 may be constructed in this fashion.

Figure 4A:
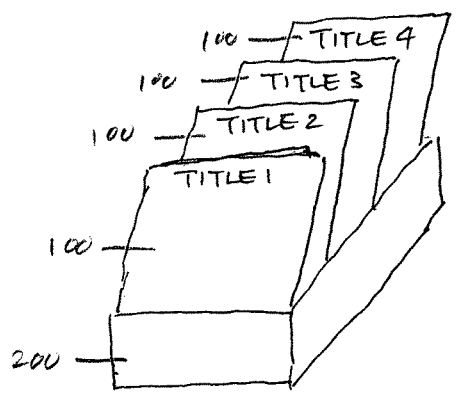
FIGS. 4A-4C shows perspective and side views of one embodiment of a container 200 for storing and displaying a plurality of flash drive packages 100.
Figure 4B:
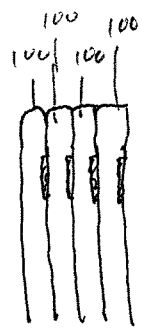
Figure 4C:
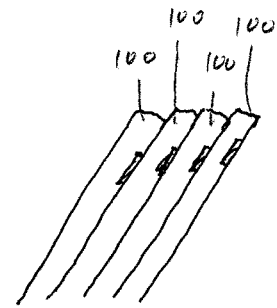

FIGS. 4A-4C shows perspective and side views of one embodiment of a container 200 for storing and displaying a plurality of flash drive packages 100. If the titles are printed along the edges of holders 120, flash drive packages 100 may be oriented in container 200 so that the titles are positioned along the top. Flash drive packages 100 may be tilted backwards or "fanned" out to view the titles. First attachment element 114 and/or second attachment element 124 may then urge flash drive packages 100 back into alignment.

Figure 5:
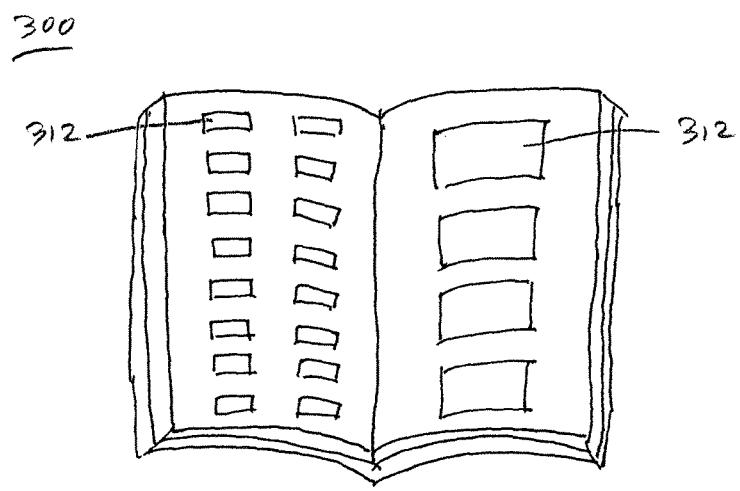
FIG. 5 shows one embodiment of an album 300 for storing and displaying a plurality of flash drive packages 100.

FIG. 5 shows one embodiment of an album 300 for storing and displaying a plurality of flash drive packages 100. Album 300 includes a plurality of compartments 312 configured to hold flash drives 110, holders 120, or both. Compartments 312 may be pockets, recesses, or other suitable devices. Compartments 312 may include an attachment element which helps to hold flash drives 110 and/or holders 120.

Figure 6A:
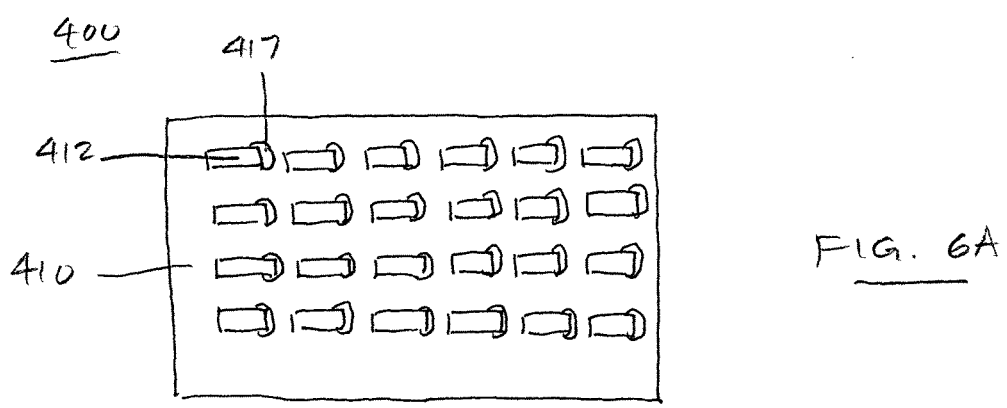
FIGS. 6A-6B show two embodiments of a wall display 400 for displaying and/or playing back a plurality of flash drives 110.
Figure 6B:
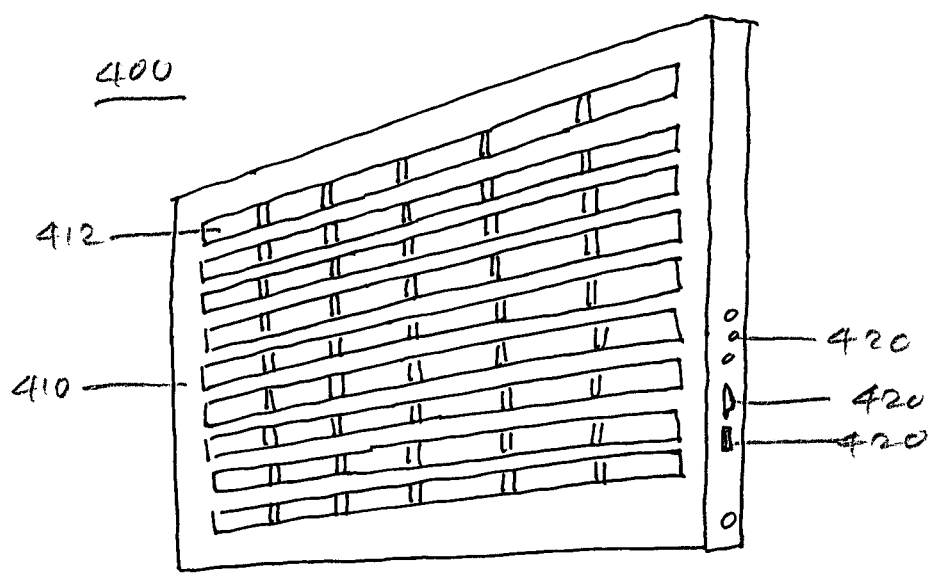

FIGS. 6A-6B show two embodiments of a wall display 400 for displaying and/or playing back a plurality of flash drives packages 100. Wall display 400 includes a panel 410 having a plurality of compartments 412 configured to hold flash drives 110, holders 120, or both. Compartments 412 may be pockets, recesses, or other suitable devices. One or more compartments 412 may include contacts 413 configured to interface with standard contacts 112 of flash drive 110. Compartments 412 may include attachment elements which help to hold flash drives 110 and/or holders 120. Compartments 412 may include dimples 417 to allow flash drives 110 to be more easily removed. Alternatively, compartments 412 may hold flash drives 110 at an angle to allow flash drives 110 to be more easily removed. Panel 410 may be at least partially made of a clear or translucent plastic which acts as a light guide, such as acrylic. When used with flash drives 110 having RFID tags 118 and visual indicators 119, portions of panel 410 may be illuminated by flash drive 110 to assist in the location of a particular flash drive 110. Wall display 400 may include one or more ports 419 for connecting to a television, media player, and/or other devices. Ports 419 may include USB, HDMI, Ethernet, audio/video out, audio/video in, printer, and/or other suitable ports.

Figure 7A:
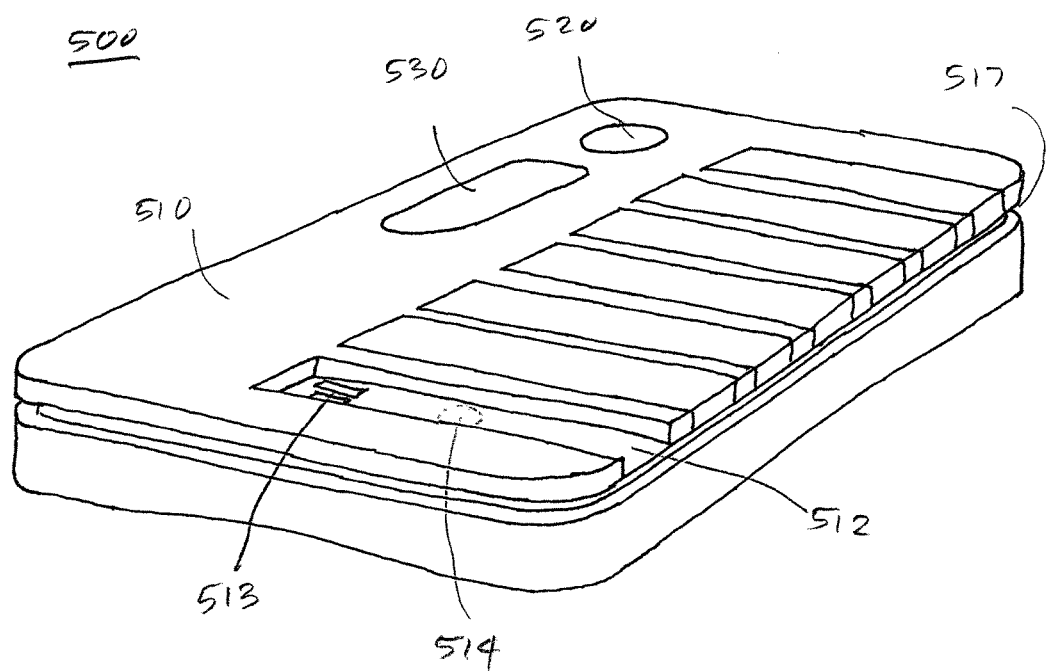
FIGS. 7A-7C show various embodiments of a file server 500 for use with flash drives 110.
Figure 7B:
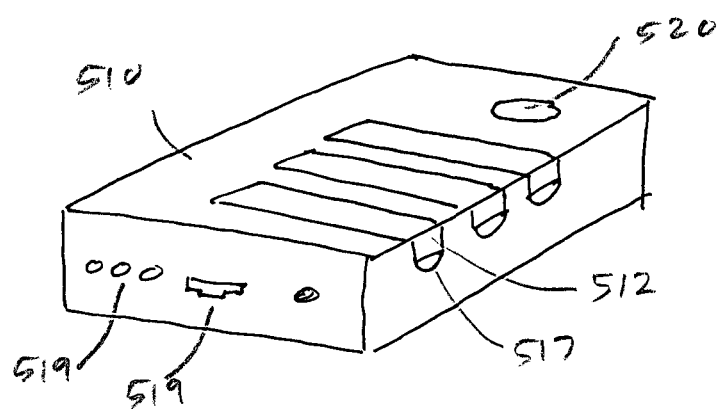
Figure 7C:
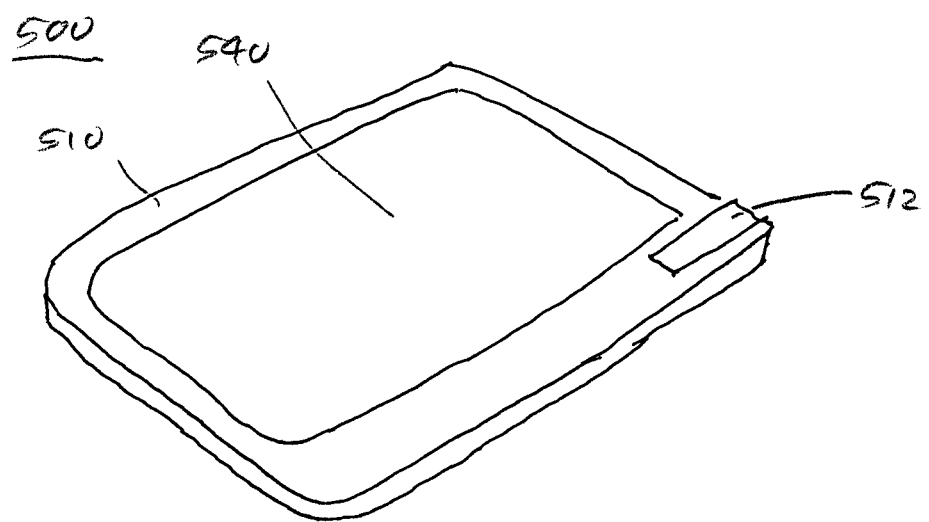

FIGS. 7A-7C show various embodiments of a file server 500 for use with flash drives 110. File server 500 includes a housing 510 having one or more recesses 512 for receiving flash drives 110. Recesses 512 may be approximately the same shape and size as flash drive 110, and flash drives 110 fit substantially flush in recesses 512. One or more recesses 512 may include contacts 513 configured to interface with standard contacts 112 of flash drive 110. Contacts 513 may be flexible or spring-loaded to improve a connection with standard contacts 112 of flash drive 110. Recesses 512 may each include an attachment element 514 to help to seat and hold flash drives 110, similar to recess 122. Attachment element 514 may be at least partially made of a magnetic material such as neodymium, a ferromagnetic material such as iron, or other suitable material. Housing 510 may also include a notch or groove 517 which allows flash drives 110 to be more easily removed. Housing 510 may have a clip or a loop to allow it to be attached to a bag, belt, or other item. File server 500 may also include a power switch 520 and a status display 530.

File server 500 may include WLAN capabilities such as WI-FI to allow laptops, smart TVs, tablets, smartphones, and other clients to access the content stored on flash drives 110. File server 500 may be configured to stream content to a plurality of clients simultaneously. File server 500 may also include WWAN capabilities to allow it to connect to the Internet, and optionally provide Internet connectivity to clients. File server 500 may also include one or more ports 519 for connecting to a television, media player, and/or other devices. Ports 519 may include USB, HDMI, Ethernet, audio/video out, audio/video in, composite video out, component video out, printer, and/or other suitable ports. File server 500 may also include SD slots and other slots which allow other media to be connected.

File server 500 may be small and portable, and may be battery-powered for convenience. File server 500 may include a battery charging port. Alternatively, file server 500 may be powered by an external power source, such as an AC adapter. File server 500 may be enclosed in a water-resistant and/or shock-resistant case, and connected to one or more cameras and used as a video recorder. File server 500 may be configured to recording from one or more cameras simultaneously to one or more respective flash drives 110.

File server 500 may include other functionality, such as a printer server or a game hub. File server 500 may be integrated with other devices, such as a projector or a video display 540, as shown in FIG. 7C.

File server 500 may be capable of obtaining authorization to access and/or play back DRM-protected content. For example, file server 500 may be capable of receiving user account information from a user to obtain authorization from a particular DRM server to access and/or play back a particular DRM-protected media file stored on flash drive 110. File server 500 may be capable of working with DRM systems such as PLAYREADY®, MARLIN, WIDEVINE®, and others.

Flash drive 110 may be capable of storing DRM-protected content. For example, flash drive 110 may be coupled to a digital video recorder or other storage device containing DRM-protected content, and DRM-protected content may be copied to flash drive. 110. Once flash drive 110 is connected to an authorized device, the DRM-protected content may be accessed. An authorized device may be a file server 500 that has been authorized, a smartphone, tablet, or computer with an application that has been authorized, or any other suitable device.

Figure 8:
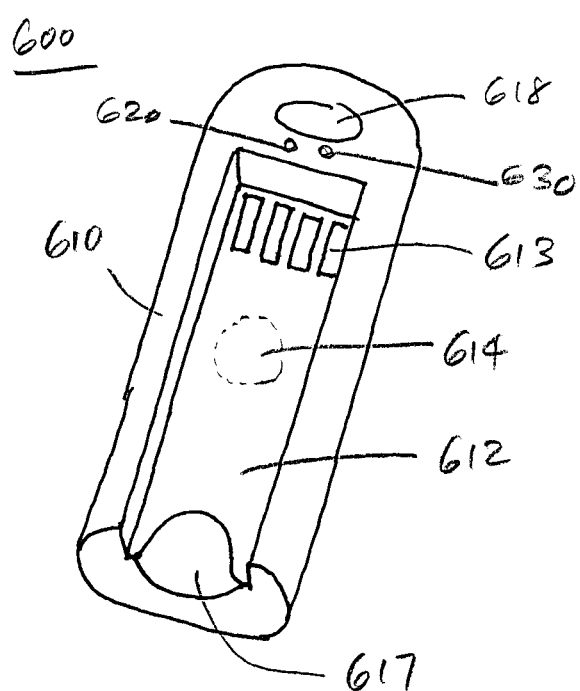
FIG. 8 shows another embodiment of a file server 600 for use with flash drive 110.

FIG. 8 shows another embodiment of a file server 600 for use with a flash drive 110. File server 600 includes a housing 610 with a recess 612 for receiving a flash drive 110. Recess 612 may be approximately the same shape and size as flash drive 110, and flash drive 110 fits substantially flush in recess 612. Recess 612 includes contacts 613 configured to interface with standard contacts 112 of flash drive 110 when flash drive 110 is placed in recess 612. Contacts 613 may be flexible or spring-loaded to improve a connection with standard contacts 112 of flash drive 110. Recess 612 may include an attachment element 614 to help seat and hold flash drive 110, similar to recess 122. Attachment element 614 may be at least partially made of a magnetic material such as neodymium, a ferromagnetic material such as iron, or other suitable material. Housing 610 may also include a notch 617 which allows flash drive 110 to be more easily removed. Housing 610 may have a clip or a loop 618, and may be used with a lanyard, keychain, or other accessory. File server 600 may also include a power switch 620 and a status display 630.

File server 600 may include WLAN capabilities such as WI-FI to allow laptops, smart TVs, tablets, smartphones, and other clients to access the content stored on flash drives 110. File server 600 may be small and portable, and may be battery-powered for convenience. File server 600 may include a battery charging port.

Figure 9:
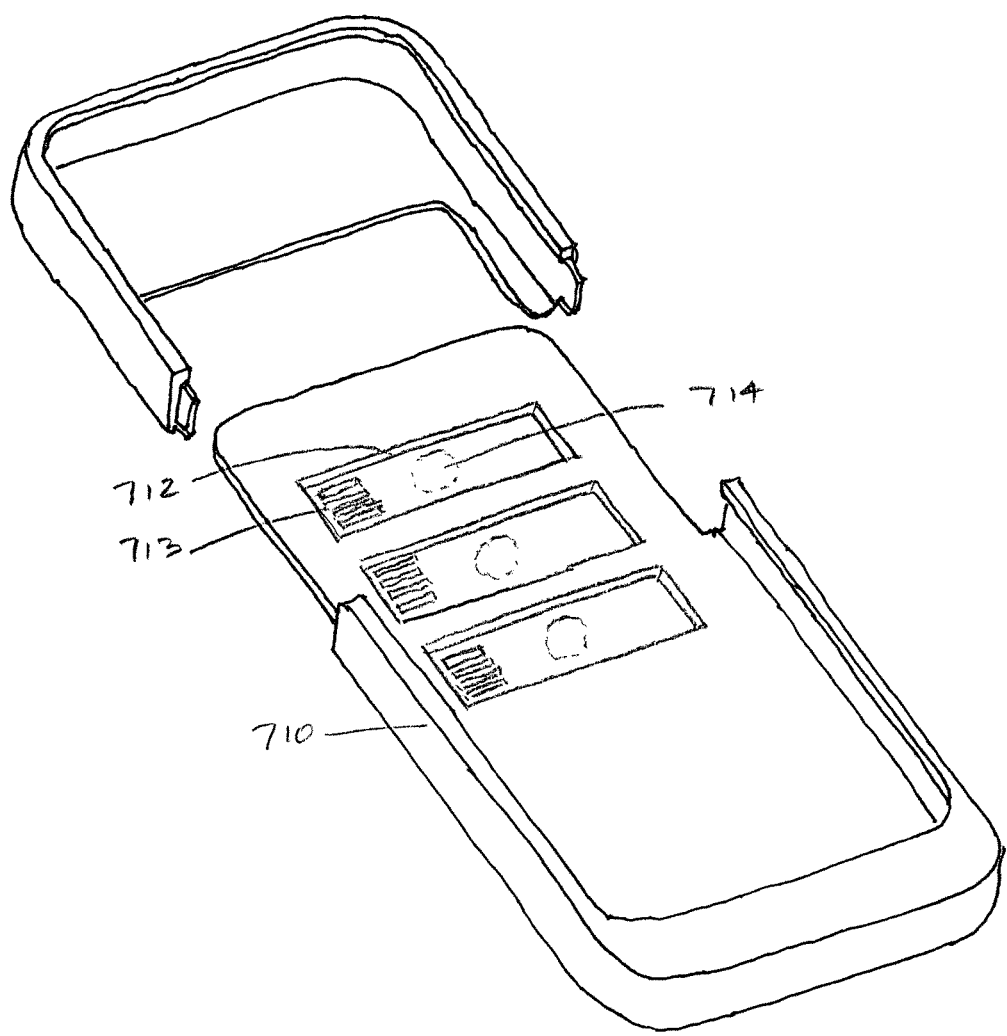
FIG. 9 shows one embodiment of a case 700 for use with flash drives 110.

FIG. 9 shows one embodiment of a case 700 for use with flash drives 110. Case 700 may include a housing 710 having one or more pieces configured to encase a smartphone or other device. Housing 710 may be configured to interface with a port of an encased device and provide access to flash drives 110 to the encased device. Housing 710 may also include a battery configured to provide power to the encased device. Housing 710 includes one or more recesses 712 for receiving flash drives 110. Recesses 712 may be formed on an inside surface and/or an outside surface of case 700. Recesses 712 may be approximately the same shape and size as flash drive 110, and flash drive 110 fits substantially flush in recesses 712. Recesses 712 each include contacts 713 configured to interface with standard contacts 112 of flash drive 110 when flash drive 110 is placed in recesses 712. Contacts 713 may be flexible or spring-loaded to improve a connection with standard contacts 112 of flash drive 110. Recesses 712 may each include an attachment element 714 to help seat and hold flash drives 110, similar to recess 122. Attachment elements 714 may be at least partially made of a magnetic material such as neodymium, a ferromagnetic material such as iron, or other suitable material.

Figure 10:
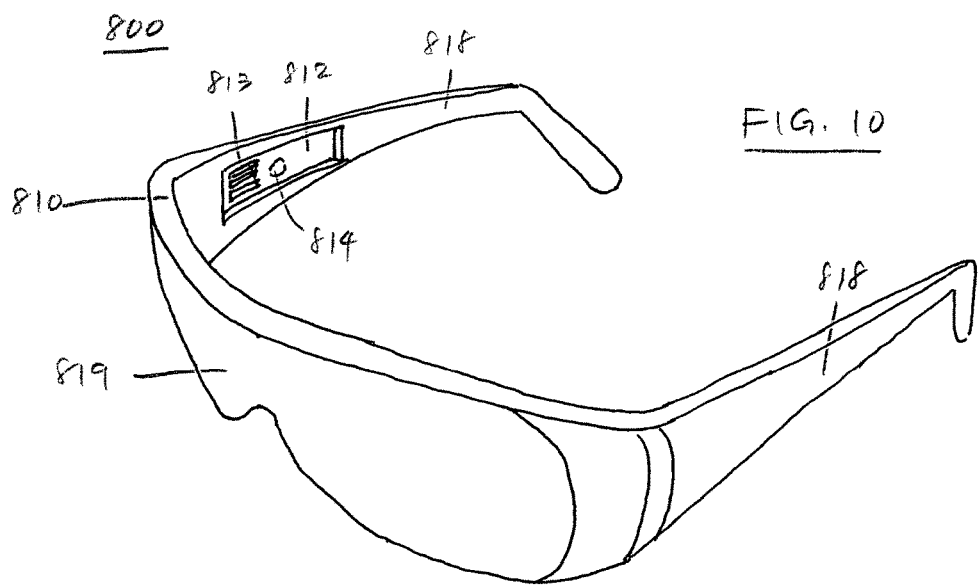
FIG. 10 shows one embodiment of a wearable display 800 for use with flash drives 110.

FIG. 10 shows one embodiment of a wearable display 800 for use with flash drives 110. Wearable display 800 may include a frame 810 having at least one recess 812 for receiving a flash drive 110. Recess 812 may be approximately the same shape and size as flash drive 110. Recess 812 includes contacts 813 configured to interface with standard contacts 112 of flash drive 110 when flash drive 110 is placed in recess 812. Contacts 813 may be flexible or spring-loaded to improve a connection with standard contacts 112 of flash drive 110. Recess 812 may include an attachment element 814 to help seat and hold flash drives 110, similar to recess 122. Attachment element 814 may be at least partially made of a magnetic material such as neodymium, a ferromagnetic material such as iron, or other suitable material. Frame 810 may include temples 818 coupled to a display element 819. Recess 812 may be formed on an inside surface of temple 818, an outside surface of temple 818, or any other suitable location. Display element 819 may be configured to display content stored on flash drive 110 to a user or wearer. Display element 819 may be capable of displaying both 2-D and 3-D content.

Figure 11:
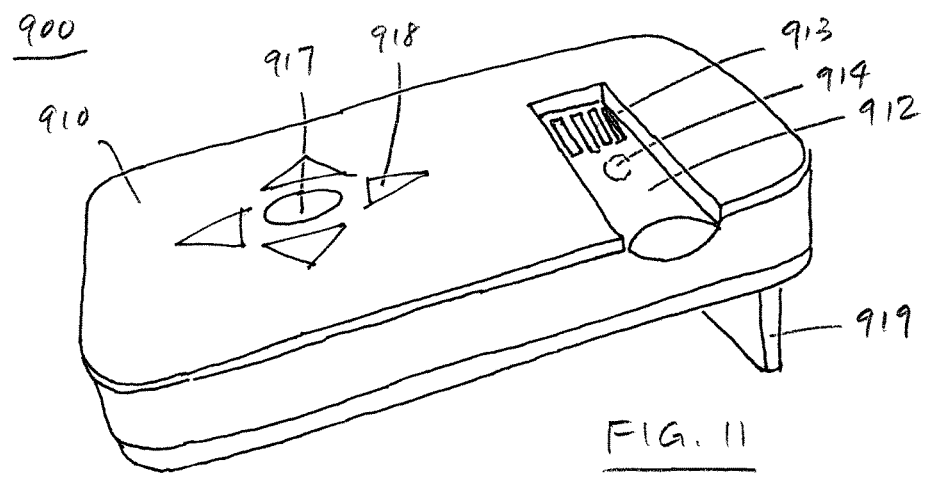
FIG. 11 shows one embodiment of a projector 900 for use with flash drives 110.

FIG. 11 shows one embodiment of a projector 900 for use with flash drives 110. Projector 900 may include a housing 910 with at least one recess 912 for receiving a flash drive 110. Recess 912 may be approximately the same shape and size as flash drive 110, and flash drive 110 fits substantially flush in recess 912. Recess 912 includes contacts 913 configured to interface with standard contacts 112 of flash drive 110 when flash drive 110 is placed in recess 912. Contacts 913 may be flexible or spring-loaded to improve a connection with standard contacts 112 of flash drive 110. Recess 912 may include an attachment element 914 to help seat and hold flash drive 110, similar to recess 122. Attachment element 914 may be at least partially made of a magnetic material such as neodymium, a ferromagnetic material such as iron, or other suitable material. Housing 910 may also include one or more controls 917 and a focus control 918. Housing 910 may also include a push-pop stand 919 for positioning and tilting projector 900.

Flash drives 110 may be sold or rented from a kiosk. Content owners may be able to control rental of flash drives 110 by using kiosk to program flash drives 110, which allows for content owners to thwart or monetize rentals.

A kiosk may allow sales and rentals of movies with auto-expiry of content based upon one or more criteria such as a number of plays, a period of time, a number days, and other parameters.

A kiosk may be capable of printing graphics on flash drives 110 with one or more blank exterior surfaces. Graphics provided by a user may be printed on an exterior surface to create flash drives 110 with individualized graphics. Graphics provided by a content owner or preloaded into kiosks may be printed on an exterior surface to create flash drives 110 with or standardized graphics.

A kiosk may be capable of transferring content to flash drives 110 on demand. A kiosk may be capable of making flash drives 110 read-only.

A kiosk may include multiple inventory slots to house preloaded or pre-printed titles based upon programmed inventory control and/or AI related to sales velocity of a particular title from a particular kiosk or regions or network-wide data.

A kiosk may have the ability to dispense ULTRAVIOLET and/or KEYCHEST redemption codes for single-use to add a particular title to a user's ULTRAVIOLET or KEYCHEST collection in conjunction with purchase of a corresponding flash drive 110, which may also enable its playback.

Users may also use a web or mobile application to upload content such as pictures, movies, videos, and other content from their PC or mobile devices to be transferred to a blank rewrite-enabled flash drive 110 that can also be imprinted on demand at a particular kiosk or location for will call or pickup, or using the interface on the kiosk to do so on the spot.

A portable player may include an optical drive capable of playing DVD/BLU-RAY discs, and may also be capable of playing flash drives 110. Alternatively, a portable player may not include an optical drive, and may be a tablet-shaped device with an optional stand. Such a portable player may not include any moving parts and be powered by a battery.

Figures 12A, 12B:
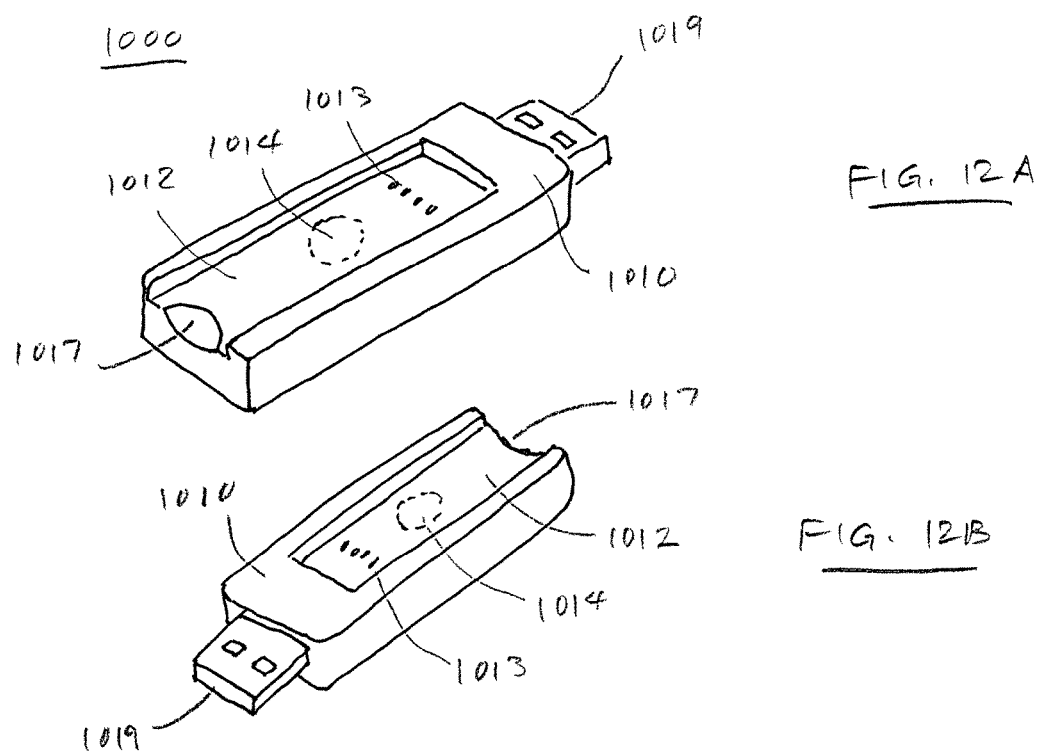
FIGS. 12A-12B show one embodiment of an adapter 1000 for use with flash drives 110.
Figure 12C:
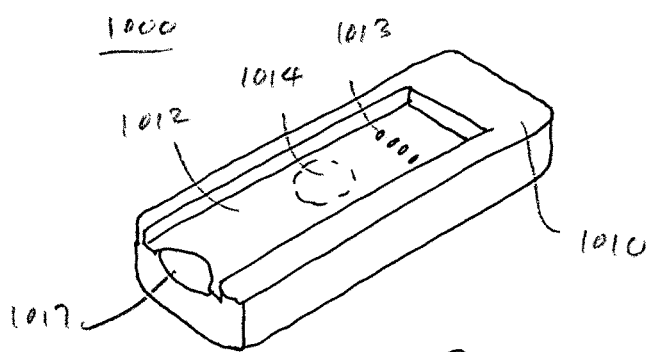
FIGS. 12C-12D show another embodiment of an adapter 1000 for use with flash drives 110.
Figure 12D:
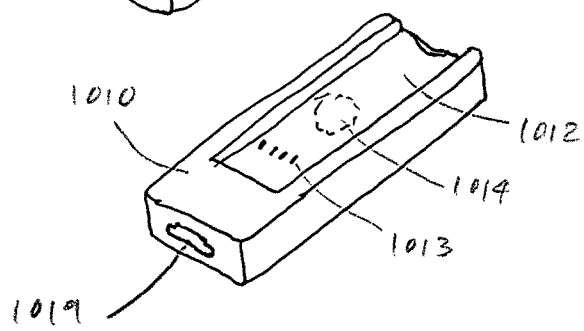

FIGS. 12A-12B show one embodiment of an adapter 1000 for use with flash drives 110. FIGS. 12C-12D show another embodiment of an adapter 1000 for use with flash drives 110. Adapter 1000 includes a housing 1010 having at least one recess 1012 for receiving flash drives 110. Recess 1012 may be approximately the same shape and size as flash drive 110, and flash drive 110 fits substantially flush in recess 1012. Recess 1012 include contacts 1013 configured to interface with standard contacts 112 of flash drive 110 when flash drive 110 is placed in recess 1012. Contacts 1013 may be flexible or spring-loaded to improve a connection with standard contacts 112 of flash drive 110. Recess 1012 may include an attachment elements 1014 to help to seat and hold flash drive 110, similar to recess 122. Attachment element 1014 may be at least partially made of a magnetic material such as neodymium, a ferromagnetic material such as iron, or other suitable material. Housing 1010 may also include a notch or groove 1017 which allows flash drives 110 to be more easily removed. Adapter 1000 may include a connector 1019, which may include one or more male or female USB connectors, Mini-USB or Micro-USB connectors, or other configurations and/or sizes. Adapter 1000 may allow flash drive 110 to be used with a standard port such as a standard USB port. Flash drive 110 may be configured to be inserted into or otherwise coupled directly to a standard port, such as standard-A USB receptacle, without the use of an adapter. Flash drive 110 may also be coupled to a standard port, such as a standard USB port, using adapter 1000.

Figure 13:
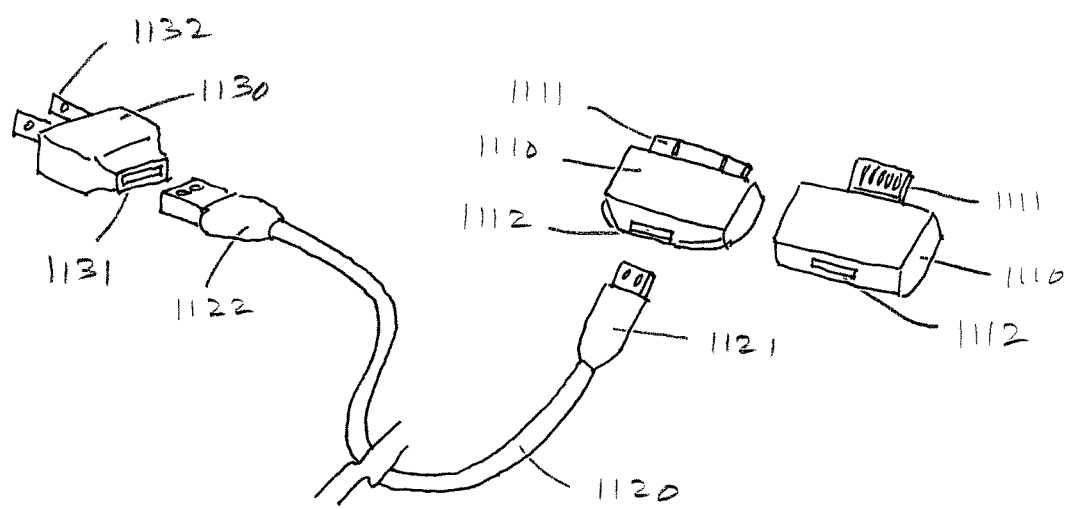
FIG. 13 shows one embodiment of a device charger 1100.

FIG. 13 shows one embodiment of a device charger 1100. Device charger 1100 may include a set of device adapters 1110, a cable 1120, and a plug adapter 1130. Device adapter 1110 may include a device connector 1111 and a cable connector 1112. Device connector 1111 may be configured to be coupled to a device to be charged, such as a smartphone, tablet, or any other suitable device. Each device adapter 1110 in a set may have a different device connector 1111 but the same cable connector 1112, which allows cable 1120 and plug adapter 1130 to be used with each of the device adapters 1110. Cable connector 1112 may be configured to be coupled to cable 1120.

Cable 1120 may include a device adapter end 1121 and a plug adapter end 1122. Device adapter end 1121 may be configured to be coupled to device adapter 1110. Plug adapter end 1122 may be configured to be coupled to plug adapter 1130. Device adapter end 1121 and plug adapter end 1122 may include the same or different connectors. For example, device adapter end 1121 may be a micro-USB connector, while plug adapter end 1122 may a USB connector. As another example, device adapter end 1121 and plug adapter end 1122 may both be micro-USB or USB connectors.

Plug adapter 1130 may include a cable connector 1131 and an outlet connector 1132. Cable connector 1131 may be configured to be coupled to cable 1120. Outlet connector 1132 may be configured to be coupled to an electrical wall outlet or other suitable power source. Plug adapter 1130 may include an AC/DC converter. Plug adapter 1130 may be available in various plug configurations for use with outlets in other countries and voltages.

Figure 14:
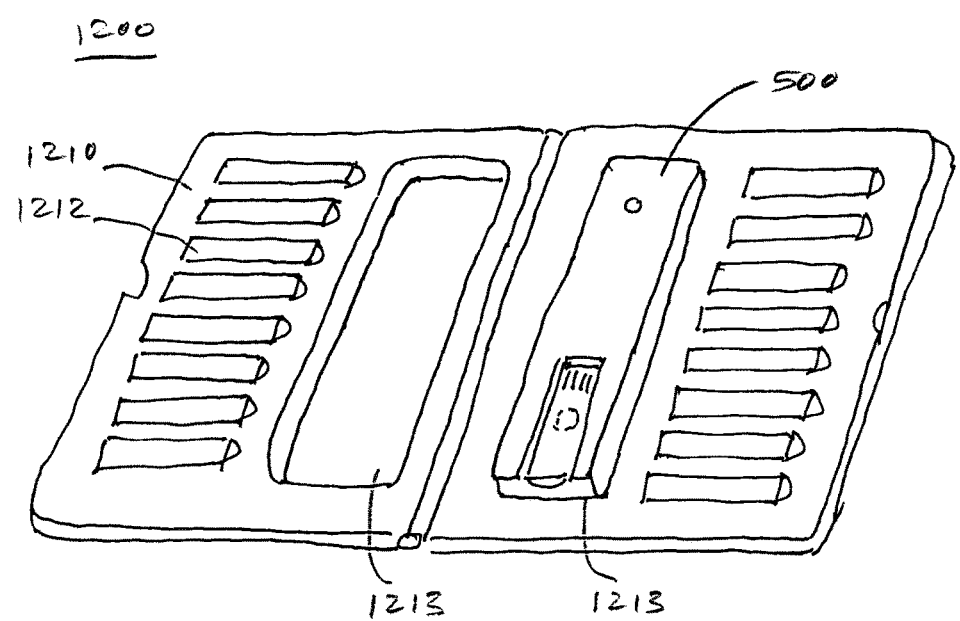
FIG. 14 shows one embodiment of a case 1200.

FIG. 14 shows one embodiment of a case 1200 for storing and displaying a plurality of flash drives 110, as well as for holding a file server 500. Case 1200 may include a housing 1210 having a plurality of compartments 1212 configured to hold flash drives 110. Compartments 1212 may be pockets, recesses, or other suitable devices. Compartments 1212 may include attachment elements which help to hold flash drives 110, similar to recess 122. Case 1200 may snap shut magnetically.

Housing 1210 also includes a compartment 1213 configured to hold a file server 500. Housing 1210 may also include a battery configured to provide power to file server 500. Housing 1210 may include a charging cable which couples to a battery charging port of file server 500. Alternatively, compartment 1213 may include a charging port which couples to a battery charging port of file server 500 when file server 500 is placed in compartment 1213. Housing 1210 may include lights or displays on an exterior to indicate a power status and other information for file server 500. Housing 1210 may be made of a material that substantially allow wireless signals to and from file server 500 to pass through.

While the foregoing has been with reference to particular embodiments of the invention, it will be appreciated by those skilled in the art that changes in these embodiments may be made without departing from the principles and spirit of the invention.

What is claimed is:

1. A device configured to be coupled to a flash drive, the flash drive having a first attachment element, the device comprising:
   a housing having a recess configured to receive the flash drive, the recess having a plurality of contacts configured to interface with a plurality of standard contacts on and coplanar with an exterior surface of the flash drive; and
   a second attachment element coupled to the housing, the second attachment element configured to be magnetically attracted to the first attachment element of the flash drive, the second attachment element configured to cooperate with the first attachment element to apply a downward force to bias the plurality of standard contacts of the flash drive against the plurality of contacts of the recess and to fully seat the flash drive in the recess when the flash drive is not fully seated in the recess.

2. The device of claim 1, wherein the second attachment element is completely enclosed in the housing.

3. The device of claim 1, wherein the second attachment element is configured to cooperate with the first attachment element to cause an audible feedback to be generated when the flash drive is seated in the recess.

4. A flash drive configured to be seated in a recess of a coupled device, the flash drive comprising:
   a plurality of standard contacts on and coplanar with an exterior surface of a housing of the flash drive, the standard contacts configured to interface with a plurality of contacts in the recess of the coupled device; and
   a first attachment element coupled to the housing of the flash drive, the first attachment element configured to be magnetically attracted to a second attachment element coupled to a housing of the coupled device, the first attachment element configured to cooperate with the second attachment element to apply a downward force to bias the plurality of standard contacts of the flash drive against the plurality of contacts of the recess and to fully seat the flash drive in the recess when the flash drive is not fully seated in the recess.

5. The flash drive of claim 4, wherein the first attachment element is completely enclosed in the flash drive.

6. The flash drive of claim 4, wherein the first attachment element is configured to cooperate with the second attachment element to cause an audible feedback to be generated when the flash drive is seated in the recess.

7. A device comprising:
   a housing;
   a recess formed in the housing, the recess having an open top, the recess configured to receive through the open top a flash drive having a first attachment element; and
   a second attachment element coupled to the housing, the second attachment element configured to be magnetically coupled with the first attachment element, the second attachment element configured to cooperate with the first attachment element to removably couple the flash drive in the recess;
   wherein the second attachment element is configured to cooperate with the first attachment element to bias standard contacts on and coplanar with an exterior surface of the flash drive against contacts at a bottom of the recess and to fully seat the flash drive in the recess when the flash drive is not fully seated in the recess.

8. The device of claim 7, wherein the recess has an open end.

9. The device of claim 7, wherein the recess is configured to allow the flash drive to fit flush in the recess when the flash drive is inserted into the recess.

10. The device of claim 7, wherein the second attachment element is coupled at a bottom of the recess.

11. The device of claim 7, wherein the second attachment element is configured to cooperate with the first attachment element to orient the flash drive in a desired direction in the recess.

12. The device of claim 7, wherein the second attachment element is configured to cooperate with the first attachment element to bias the flash drive down in the recess.

13. A flash drive comprising:
    a housing; and
    a first attachment element coupled to the housing, the first attachment element configured to be magnetically coupled with a second attachment element of a coupled device, the first attachment element configured to cooperate with the second attachment element to removably couple the flash drive in a recess of the coupled device;
    wherein the first attachment element is configured to cooperate with the second attachment element to bias standard contacts on and coplanar with an exterior surface of the housing against contacts at a bottom of the recess and to fully seat the flash drive in the recess when the flash drive is not fully seated in the recess.

14. The flash drive of claim 13, wherein the first attachment element is configured to cooperate with the second attachment element to orient the flash drive in a desired direction in the recess.

15. The flash drive of claim 13, wherein the first attachment element is configured to cooperate with the second attachment element to bias the flash drive down in the recess.

\* \* \* \* \*